(12) United States Patent
Tsai et al.

(10) Patent No.: US 9,349,660 B2
(45) Date of Patent: May 24, 2016

(54) INTEGRATED CIRCUIT MANUFACTURING TOOL CONDITION MONITORING SYSTEM AND METHOD

(75) Inventors: Po-Feng Tsai, Taipei (TW); Chia-Tong Ho, Taipei (TW); Sunny Wu, Zhudong Town (TW); Jo Fei Wang, Hsin-Chu (TW); Jong-I Mou, Hsinpu Township, Hsinchu County (TW); Chin-Hsiang Lin, Hsin-Chu (TW)

(73) Assignee: Taiwan Semiconductor Manufacturing Company, Ltd., Hsin-Chu ( * ) Notice: Subject to any disclaimer, the term of this patent is extended or adjusted under 35 U.S.C. 154(b) by 741 days.

(21) Appl. No.: 13/308,644

(22) Filed: Dec. 1, 2011

(65) Prior Publication Data

US 2013/0144419 A1 Jun. 6, 2013

(51) Int. Cl.
*G06F 19/00* (2011.01)
*H01L 21/66* (2006.01)

(52) U.S. Cl.
CPC ......... *H01L 22/20* (2013.01); *H01L 2924/0002* (2013.01)

(58) Field of Classification Search
USPC ........................................................ 700/108
See application file for complete search history.

(56) References Cited

U.S. PATENT DOCUMENTS

| | | | |
|---|---|---|---|
| 5,497,381 A * | 3/1996 | O'Donoghue et al. ....... | 714/745 |
| 5,677,208 A * | 10/1997 | Itou et al. .................... | 438/199 |
| 5,787,190 A * | 7/1998 | Peng et al. ................... | 382/145 |
| 6,247,853 B1 * | 6/2001 | Papadopoulou et al. ....... | 716/52 |
| 6,248,602 B1 * | 6/2001 | Bode et al. ................... | 438/14 |
| 6,548,886 B1 * | 4/2003 | Ikari et al. ................... | 257/610 |
| 6,778,873 B1 | 8/2004 | Wang et al. | |
| 7,187,990 B2 * | 3/2007 | Jang et al. .................... | 700/31 |
| 7,445,446 B2 * | 11/2008 | Weichert et al. ............. | 432/247 |
| 7,511,797 B2 * | 3/2009 | Van De Mast et al. ........ | 355/53 |
| 7,632,349 B2 * | 12/2009 | Itou et al. ..................... | 117/14 |
| 8,108,060 B2 * | 1/2012 | Tsen et al. .................... | 700/108 |
| 8,224,475 B2 * | 7/2012 | Tsai et al. ..................... | 700/121 |
| 8,394,719 B2 * | 3/2013 | Tsen et al. .................... | 438/692 |
| 8,396,583 B2 * | 3/2013 | Tsai et al. ..................... | 700/104 |
| 8,406,912 B2 * | 3/2013 | Chen et al. ................... | 700/121 |
| 8,437,870 B2 * | 5/2013 | Tsai et al. ..................... | 700/110 |
| 8,529,695 B2 * | 9/2013 | Harada et al. ................ | 117/13 |
| 8,606,387 B2 * | 12/2013 | Tsai et al. ..................... | 700/108 |
| 2002/0017708 A1 * | 2/2002 | Takagi et al. ................. | 257/678 |
| 2002/0048020 A1 * | 4/2002 | Yoshitake et al. ............ | 356/399 |
| 2003/0018406 A1 * | 1/2003 | Yoshitake et al. ............ | 700/121 |
| 2004/0161626 A1 * | 8/2004 | Kwon et al. .................. | 428/577 |
| 2005/0192698 A1 | 9/2005 | Cheng et al. | |
| 2005/0193362 A1 * | 9/2005 | Phan et al. .................... | 716/19 |
| 2006/0100730 A1 * | 5/2006 | Parkes et al. ................. | 700/108 |
| 2007/0044709 A1 * | 3/2007 | Itou et al. ..................... | 117/19 |
| 2007/0076205 A1 * | 4/2007 | Schulz ......................... | 356/401 |
| 2009/0032847 A1 * | 2/2009 | Tomita ......................... | 257/211 |
| 2010/0234970 A1 * | 9/2010 | Tsai et al. ..................... | 700/32 |
| 2010/0292824 A1 * | 11/2010 | Tsen et al. .................... | 700/105 |

(Continued)

*Primary Examiner* — Carlos Ortiz Rodriguez
*Assistant Examiner* — Kelvin Booker
(74) *Attorney, Agent, or Firm* — Haynes and Boone, LLP

(57) ABSTRACT

A system and method for monitoring a process tool of an integrated circuit manufacturing system are disclosed. An exemplary method includes defining zones of an integrated circuit manufacturing process tool; grouping parameters of the integrated circuit manufacturing process tool based on the defined zones; and evaluating a condition of the integrated circuit manufacturing process tool based on the grouped parameters.

20 Claims, 7 Drawing Sheets

(56) References Cited

U.S. PATENT DOCUMENTS

| | | | |
|---|---|---|---|
| 2010/0312374 A1* | 12/2010 | Tsai et al. | 700/110 |
| 2011/0213478 A1* | 9/2011 | Tsen et al. | 700/96 |
| 2011/0238198 A1* | 9/2011 | Tsai et al. | 700/104 |
| 2011/0259259 A1* | 10/2011 | Harada et al. | 117/13 |
| 2011/0263126 A1* | 10/2011 | Harada et al. | 438/691 |
| 2012/0119386 A1* | 5/2012 | Ito et al. | 257/777 |
| 2012/0130525 A1* | 5/2012 | Tsai et al. | 700/108 |
| 2013/0108147 A1* | 5/2013 | Harada et al. | 382/149 |
| 2013/0271595 A1* | 10/2013 | Hiroi et al. | 348/80 |
| 2014/0067324 A1* | 3/2014 | Ho et al. | 702/183 |

* cited by examiner

INTEGRATED CIRCUIT MANUFACTURING TOOL CONDITION MONITORING SYSTEM AND METHOD

BACKGROUND

The integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC manufacturing are needed. For example, IC manufacturing typically uses multiple process steps that require many tools, both production and support related, such that IC manufacturers often focus on monitoring a tools hardware and associated process to ensure and maintain stability, repeatability, and yields in IC manufacturing. Such tool monitoring may be achieved by fault detection and classification (FDC) systems, which monitor tools during processing and identify faults in the tools that causes the processing to stray from that which is expected. However, conventional tool monitoring systems and methods provide little correlation between identified faults in the tools and a root cause for the identified faults. Accordingly, although existing approaches have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
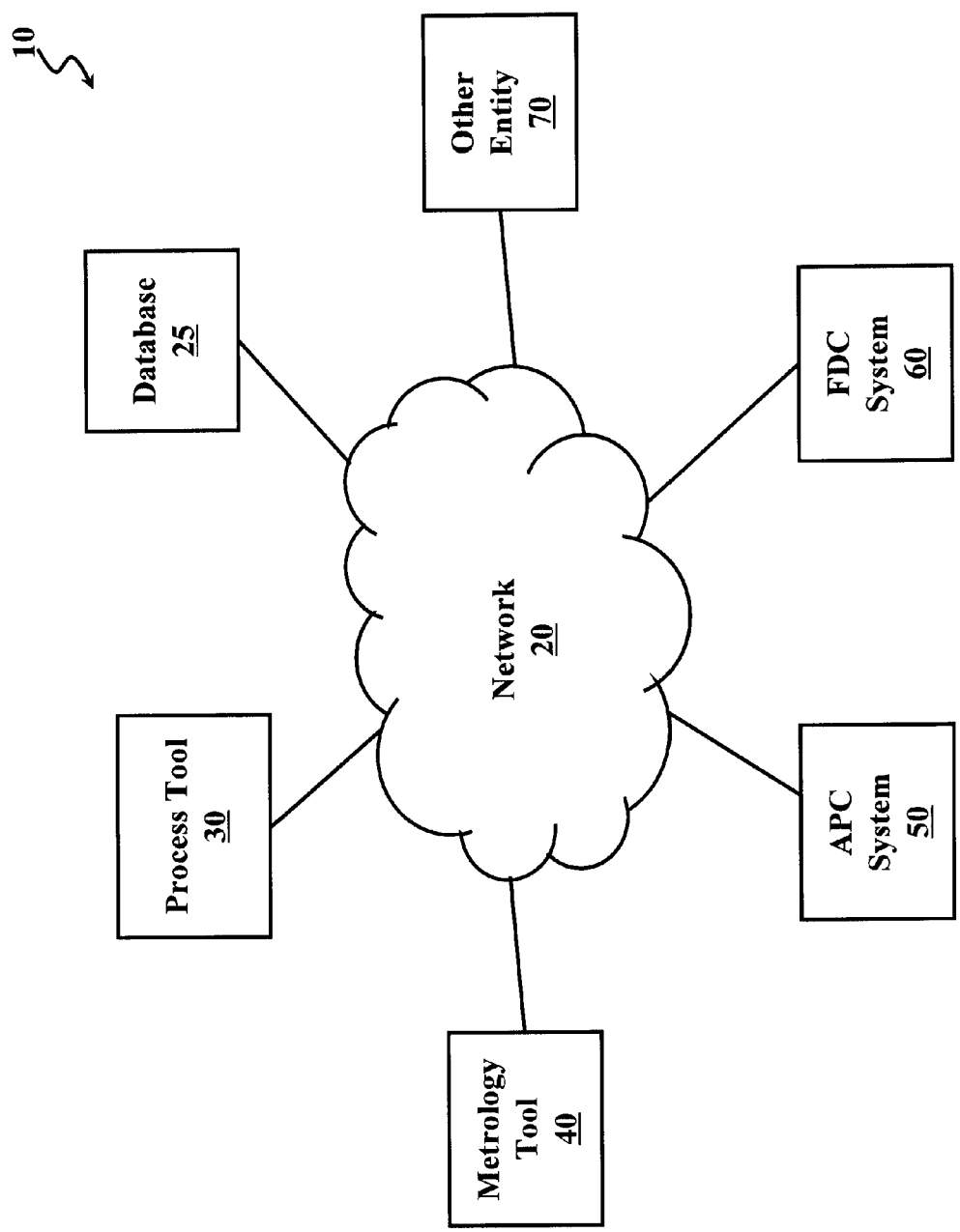
FIG. 1 is a block diagram of an integrated circuit manufacturing system according to various aspects of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 is a block diagram of an integrated circuit manufacturing system 10 according to various aspects of the present disclosure. The integrated circuit manufacturing system 10 may be a virtual integrated circuit manufacturing system (also referred to as a "virtual fab"). The integrated circuit manufacturing system 10 implements one or more integrated circuit manufacturing processes to fabricate integrated circuits. For example, the integrated circuit manufacturing system 10 may implement one or more semiconductor manufacturing processes that fabricate a plurality of substrates (or wafers). A substrate includes a wafer, a semiconductor substrate, a mask (photomask or reticle, collectively referred to as mask), or any base material on which processing is conducted to produce layers of material, pattern features, and/or integrated circuits. FIG. 1 is not a comprehensive diagram of the entire integrated circuit manufacturing system 10. Instead, for simplicity and clarity, FIG. 1 shows selected portions of the overall system to facilitate an understanding of various aspects of the present disclosure.

The integrated circuit manufacturing system 10 includes a network 20 that enables various entities (a database 25, a process tool 30, a metrology tool 40, an advanced process control (APC) system 50, a fault detection and classification (FDC) system 60, and other entity 70) to communicate with one another. The integrated circuit manufacturing system 10 may include more than one of each of the entities in the depicted embodiment, and may further include other entities not illustrated in the depicted embodiment. In the present example, each entity of the integrated circuit manufacturing system 10 interacts with the other entities via the network 20 to provide services to and/or receive services from the other entities. The network 20 may be a single network or a variety of different networks, such as an intranet, an Internet, other network, or combinations thereof. The network 20 includes wired communication channels, wireless communication channels, or combinations thereof.

The database 25 stores data associated with the integrated circuit manufacturing system 10, and particularly data associated with the integrated circuit fabrication processes. In the depicted embodiment, the database 25 stores data collected from the process tool 30, the metrology tool 40, the APC system 50, the FDC system 60, the other entity 70, or a combination thereof. For example, the database 25 stores data associated with wafer characteristics of wafers processed by the process tool 30 (such as that collected by the metrology tool 40 as further described below), data associated with parameters implemented by the process tool 30 to process such wafers, data associated with analysis of the wafer characteristics and/or parameters by the APC system 50 and the FDC system 60, and other data associated with the integrated circuit manufacturing system 10. The process tool 30, metrology tool 40, APC system 50, FDC system 60, and other entity 70 may each have an associated database.

The process tool 30 performs an integrated circuit fabrication process. In the present example, the process tool 30 is a chemical vapor deposition (CVD) tool used for epitaxial growth. The process tool 30 may thus be referred to as a CVD epitaxial tool. A wafer can be placed into the CVD epitaxial tool and subjected to an epitaxial process, such as vapor-phase epitaxy, to form an epitaxial feature of the wafer. The CVD epitaxial tool may include a chamber, a gas source, an exhaust system, a heat source, a cooling system, and other hardware. The chamber serves as a controlled environment for performing the epitaxial process. The gas source provides reactant and purging gases during the epitaxial process, and the exhaust system maintains a pressure within the chamber during the epitaxial process. The heat source includes lamp modules: a bottom inner lamp module, a bottom outer lamp module, a top inner lamp module, and a top outer lamp module. Each lamp module includes an array of infrared lamps that transmit energy to the chamber of the CVD epitaxial tool during the epitaxial process, thereby heating the chamber to a desired chamber temperature and/or the wafer to a desired wafer temperature during the epitaxial process.

To ensure that the epitaxial feature exhibits target wafer characteristics (such as thickness and constituent concentrations), the epitaxial process forms the epitaxial feature according to a predetermined (or predefined) epitaxial process recipe. The predetermined (or predefined) epitaxial process recipe specifies various parameters that are implemented by the CVD epitaxial tool to achieve the target wafer characteristics. Such parameters include process time, type of precursor gas, flow rate of precursor gas, chamber temperature, chamber pressure, wafer temperature, other parameters, or combinations thereof. During the epitaxial process, the various hardware of the CVD epitaxial tool (such as the chamber, gas source, exhaust system, heat source, and cooling system) are configured to achieve the specified parameters. The process tool 30 includes one or more sensors that monitor the parameters during processing of the wafers, such during the epitaxial process. For example, the CVD epitaxial tool includes one or more sensors that monitor the various parameters associated with the CVD epitaxial tool, such as chamber pressure, chamber temperature, wafer temperature, gas flow, deposition time, other parameters (such as various characteristics of lamp modules of the CVD epitaxial tool, including voltage, current, power, resistance, other characteristic, or combinations thereof).

The metrology tool 40 measures and collects data associated with wafers during integrated circuit fabrication. For example, the metrology tool 40 performs inline measurements on the processed wafers to obtain information about various wafer characteristics of the wafers, such as a critical dimension of a feature of the wafer (for example, a line width of the feature), a thickness of a material layer of the wafer, an overlay accuracy between layers or features of the wafer, a dopant profile (or concentration) of a feature, a size and/or type of defect, electrical characteristics of a feature, other wafer characteristics, or combinations thereof. In the depicted embodiment, the metrology tool 40 measures wafer characteristics of wafers processed by the process tool 30. For example, the metrology tool 40 measures a thickness, electrical properties (such as resistivity), surface roughness, other characteristics, or combinations thereof of the epitaxial features of the wafers formed by the epitaxial process performed by the process tool 30. The metrology tool 40 may include electrical tools, optical tools, analytical tools, other tools, or combinations thereof to measure and collect such data. Such tools include microscopes (for example, scanning electron microscopes and/or optical microscopes), micro-analytical tools, line width measurement tools, mask and reticle defect tools, particle distribution tools, surface analysis tools, stress analysis tools, resistivity and contact resistance measurement tools, mobility and carrier concentration measurement tools, junction depth measurement tools, film thickness tools, gate oxide integrity test tools, capacitance-voltage measurement tools, focused ion beam (FIB) tools, laser surface defect scanners, residual gas analyzers, process tool particle counters, wafer assessment testing tools, other metrology tools, or combinations thereof.

The APC system 50 monitors wafer characteristics of the processed wafers and uses inline metrology data (for example, such as data collected by the metrology tool 40), process models, and various algorithms to provide dynamic fine-tuning of intermediate process targets to enhance final device targets of the wafers. Fine-tuning such process targets may be referred to as control actions, which compensate for tool issues and/or process issues that may produce wafer characteristic variations. The APC system 50 can implement control actions in real time, wafer-to-wafer, lot-to-lot, or a combination thereof. Real time process control actions enable changes to the parameters implemented by the process tool 30 for each wafer while it is being processed based on information from in-situ monitoring. In an example, a wafer may be evaluated after it has undergone one processing step, such that a subsequent processing step on the wafer can be adjusted. Wafer-to-wafer control actions control every wafer within a lot independently, for example, by monitoring a wafer as it exits the process tool 30 via inline metrology data (collected by the metrology tool 40) and adjusting the process performed in the process tool 30 (in other words, adjusting the parameters of the process tool 30) for subsequent wafers based on the inline metrology data. Lot-to-lot control actions enable changes to parameters implemented by the process tool 30 for each wafer lot. In the depicted embodiment, the APC system 50 implements control actions to modify the epitaxial process recipe performed by the process tool 30 to form the epitaxial features of the wafers. For example, the APC system 50 (based on inline metrology data of processed wafers, process models, and various algorithms) modifies the predetermined epitaxial process recipe (specifically the parameters implemented by the process tool 30, such as process time, flow rate of gas, chamber pressure, chamber temperature, wafer temperature, or other process parameter) for each processed wafer to ensure that the epitaxial features of each processed wafer exhibit the target characteristics.

The FDC system 60 evaluates conditions of the process tool 30 to detect tool issues, such as tool condition deterioration, by monitoring the parameters implemented by the process tool 30 during the integrated circuit fabrication process, and wafer characteristics achieved by parameters implemented by the process tool 30 during the integrated circuit fabrication process. Typically, the FDC system 60 implements statistical process control (SPC) to track and analyze a condition of the process tool 30. For example, the FDC system 60 may implement SPC charts that document historical process performance of the process tool 30 by charting SPC data associated with the process over time. Such SPC data includes the parameters and/or the wafer characteristics associated with multiple wafers processed by the process tool 30. When the SPC data indicates that parameters and/or wafer characteristics have departed from acceptable targets (in other words, when the FDC system 60 detects a fault or abnormality), the FDC system 60 triggers an alarm and may notify an operator of the process tool 30, halt the process performed by the process tool 30, take another action, or a combination thereof, so that any issues with the process tool 30 may be identified and remedied.

In the present example, to detect issues with the CVD epitaxial tool, the FDC system 60 monitors the parameters implemented by the process tool 30 to form the epitaxial features of the wafers. The FDC system 60 evaluates these parameters and wafer characteristics to detect abnormalities, or faults, during operation of the CVD epitaxial tool. In an example, an abnormality is indicated when, during an epitaxial process, a chamber pressure or chamber temperature varies (higher or lower) significantly from a specified chamber pressure or chamber temperature, such as the predetermined epitaxial process recipe. In another example, an abnormality is indicated when, during an epitaxial process, a flow rate of a precursor gas varies (higher or lower) significantly from a specified flow rate of the precursor gas, such as the predetermined epitaxial process recipe. In yet another example, an abnormality is indicated when a characteristic of an epitaxial feature of a wafer formed by the CVD epitaxial tool varies significantly from its target characteristic. Such abnormalities may indicate issues with the process tool 30. For example, damaged or aging hardware of the CVD epitaxial tool may cause the chamber pressure, chamber temperature, and/or flow rate of precursor gas to vary from the expected chamber pressure, chamber temperature, and/or flow rate of precursor gas.

Figure 2:
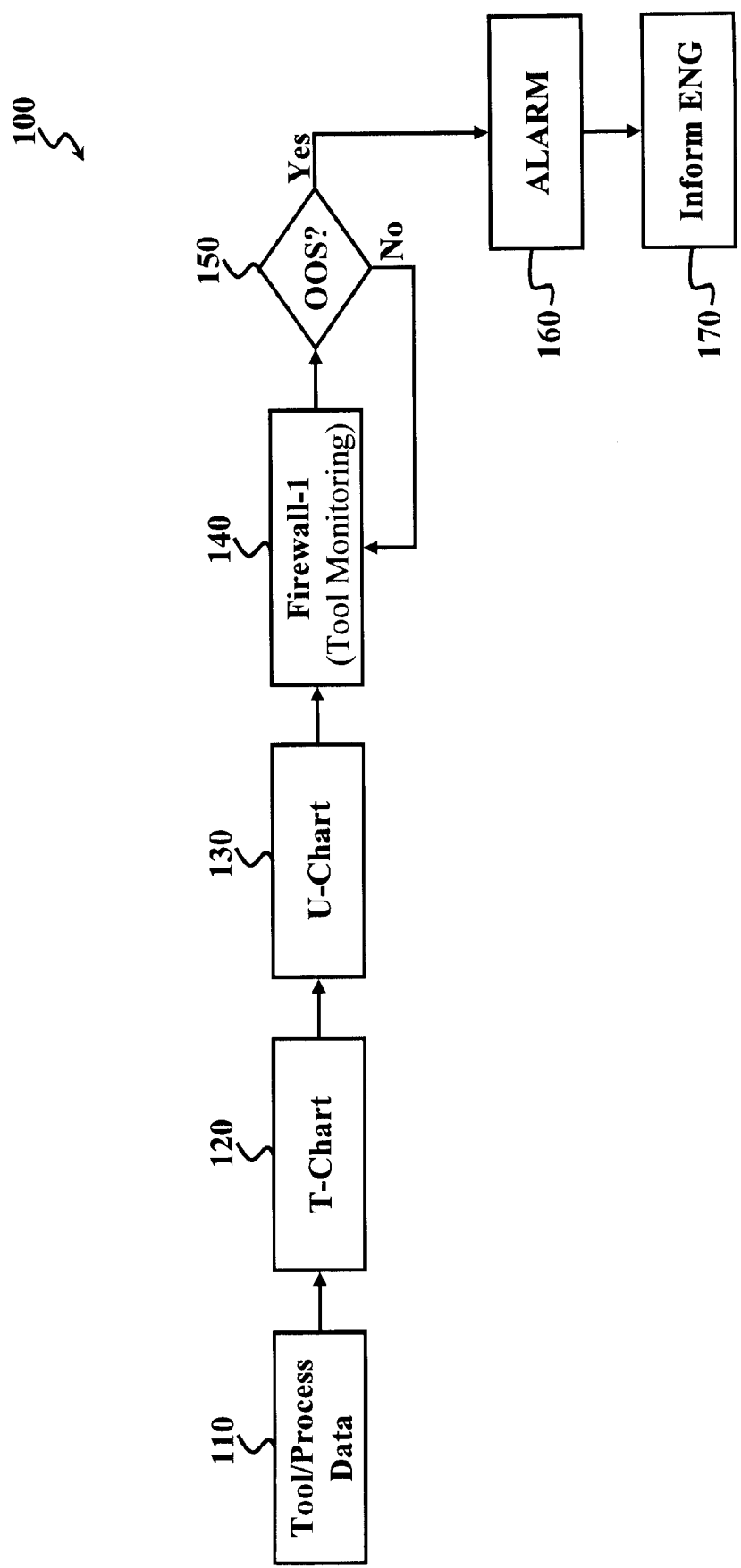
FIG. 2 is a block diagram of a tool monitoring process flow that can be implemented by the integrated circuit manufacturing system of FIG. 1 according to various aspects of the present disclosure.

FIG. 2 is a block diagram of a tool monitoring process flow 100 that can be implemented by the integrated circuit manufacturing system 10 of FIG. 1 according to various aspects of the present disclosure. In the present example, the FDC system 60 implements the tool monitoring process flow 100 to monitor a condition of the process tool 30 (in the present example, the CVD epitaxial tool). Additional steps can be provided in the tool monitoring process flow 100, and some of the steps described can be replaced or eliminated for additional embodiments of the tool monitoring process flow 100.

At block 110 and block 120, data associated with various processed wafers is collected and compiled in time-series charts (T-charts). In the present example, the data includes parameter data associated with the parameters implemented by the process tool 30 to form the epitaxial features of each wafer. As noted above, the parameters include chamber pressure, chamber temperature, wafer temperature, gas flow, deposition time, other parameters (such as various characteristics of lamp modules of the CVD epitaxial tool, including voltage, current, power, resistance, other characteristics, or combinations thereof). In an example, the epitaxial process performed on each wafer includes ten steps with each step taking about one minute, such that the epitaxial process takes about ten minutes. Sensors of the process tool 30 record parameter data every second for each of the parameters. Thus, for a single parameter associated with the process tool 30, such as flow rate of a particular precursor gas, approximately 600 parameter data points may be collected—the flow rate of the particular precursor gas every second of the epitaxial process. Such parameter data is collected for each of the parameters associated with the process tool 30, and the parameter data may be stored in the database 25 or other database associated with the process tool 30.

At block 130 and block 140, statistical analysis is performed on the time-series data (T-charts), thereby reducing the amount of data for evaluation, and tool monitoring is performed based on the statistically analyzed time-series data. For example, statistical process control is implemented by the FDC system 60 to transform the time-series data into SPC charts (for example, Xbar-R control charts, Xbar-S control charts, I-MR control charts, C control charts, U control charts, Z control charts, other control charts, or combinations thereof) that can be used to evaluate a condition of the process tool 30. In the present example, statistical process control transforms the time-series data (T-charts), specifically the time-series parameter data, into U control charts (U-charts) for analyzing performance of the process tool 30. The U-charts analyze the time-series data according to binomial and/or Poisson statistics, where the process limits are defined by the statistical analysis (such as a standard deviation of the analyzed parameter data). For example, the U-charts include a centerline that represents an average (mean) value of the analyzed parameter data, and an upper control limit (maximum) and lower control limit (minimum) defined by statistical analysis, particularly within a number of standard deviations of the analyzed parameter data. Returning to the single parameter example noted above (for example, the flow rate of the particular precursor gas), statistical analysis reduces the approximately 600 parameter data points collected such that it is represented by parameter data that represents an average (mean), a standard deviation, a maximum, and a minimum associated with the single parameter. Such reduction is performed for each wafer processed by the process tool 30, and the parameter data can be compiled and analyzed to provide various U-charts for each parameter (for example, about 40 U-charts).

At block 150, as the process tool 30 processes various wafers, the FDC system 60 analyzes parameter data associated with processes implemented to fabricate various wafers to determine whether the parameter data is out of specification (OOS), for example, whether the parameter data falls within the upper and lower control limits defined by the statistically analyzed parameter data (such as the SPC charts, and here, the U-charts). Out of specification parameter data indicates a fault (or abnormality) in the process tool 30. If the FDC system 60 determines that the parameter data is not out of specification (in other words, the parameter data falls within the upper and lower control limits prescribed by the various SPC charts), the process tool 30 continues to process wafers and the FDC system 60 continues to monitor the condition of the process tool 30. If the FDC system 60 determines that the parameter data is out of specification (in other words, the parameter data falls outside the upper and lower control limits prescribed by the various SPC charts), at block 160, the FDC system 60 triggers an alarm and, at block 170, notifies an operator or engineer of the process tool 30. In conjunction with the alarm, the FDC system 60 may halt the process performed by the process tool 30, take another action, or a combination thereof. The operator or engineer then determines how the process tool 30 contributed to the out of specification parameter data—for example, the operator or engineer determines whether a hardware failure of the process tool 30 caused the parameter data to fall out of specification.

Figure 3:
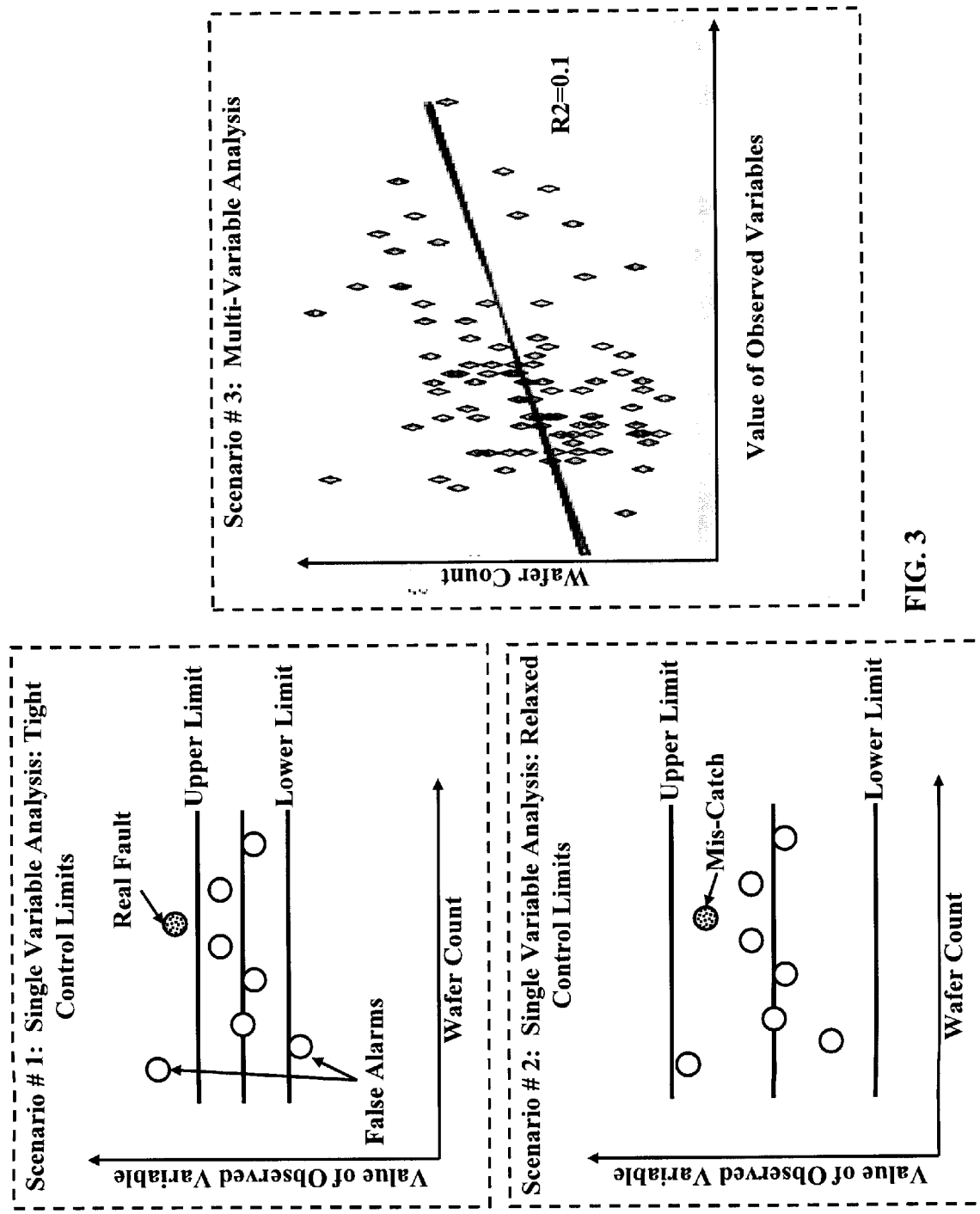
FIG. 3 depicts three scenarios that may arise in the tool monitoring process flow of FIG. 2 according to various aspects of the present disclosure.

FIG. 3 depicts three scenarios that may arise in the tool monitoring process flow 100, particularly at block 140 through block 170, according to various aspects of the present disclosure. Scenario #1 and Scenario #2 implement single variable analysis to evaluate a condition of the process tool 30. For example, Scenario #1 and Scenario #2 evaluate parameter data associated with a single parameter of the process performed by the process tool 30. The statistical analysis indicates a wafer count associated with a value of an observed variable (here, the observed parameter data of the single parameter of the process tool 30). In Scenario #1, tight upper and lower control limits are applied that lead to the FDC system 60 triggering an alarm when a real fault (or abnormality) in processing occurs, yet also triggering an alarm when faults (or abnormalities) in processing have not occurred. In Scenario #2, relaxed upper and control limits are applied that lead to the FDC system 60 missing the real fault (or abnormality) in processing. Tighter upper and lower control limits, such as that depicted in Scenario #1, are thus typically implemented in the tool monitoring process flow 100 to ensure that the FDC system 60 catches faults (or abnormalities). However, as illustrated in Scenario #1, this leads to the FDC system 60 issuing false alarms, which lead to the operator or engineer trying to determine what about the condition of the process tool 30 is causing the fault (or abnormality) when a condition of the process tool 30 is not to blame for the fault (or abnormality). In contrast, Scenario #3 implements multi-variable analysis, such as principal component analysis, to observe whether the value of more than one observed variable (here, the observed parameter data of more than one parameter of the process tool 30) falls out of specification. Though the multi-variable analysis provides more accurate fault (or abnormality) monitoring, there is little correlation between the parameter data observed in the multi-variable analysis and a root cause of the fault (or abnormality). The operator or engineer thus begins troubleshooting why the fault (or abnormality) occurs with little knowledge as to what portion of the tool is causing the fault (or abnormality), such as a physical area of the process tool 30 that contributes to the fault (or abnormality). Accordingly, whether the FDC system 60 monitors the process tool 30 using Scenario #1, Scenario #2, or Scenario #3, the analyzed parameter data provides little physical meaning or linkage to the process tool 30, such that FDC system 60 provides little indication as to a root cause of the fault (or abnormality).

Figure 4:
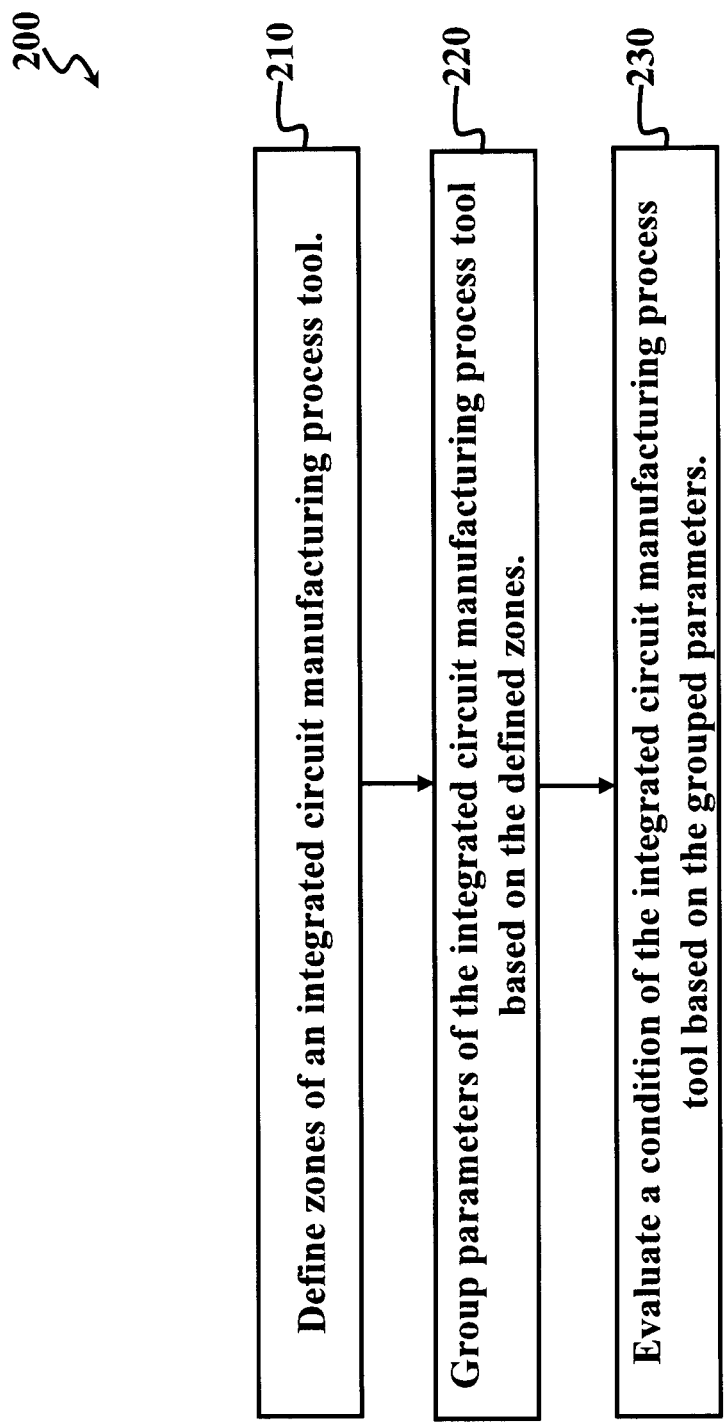
FIG. 4 is a flow chart of a method for monitoring a condition of a process tool that can be implemented by the integrated circuit manufacturing system of FIG. 1 according to various aspects of the present disclosure.

FIG. 4 is a flow chart of a method 200 for monitoring a condition of a process tool that can be implemented by the integrated circuit manufacturing system 10 of FIG. 1 according to various aspects of the present disclosure. In the present example, the FDC system 60 implements the method 200 to monitor a condition of the process tool 30 (in the present example, the CVD epitaxial tool). Additional steps can be provided in the method 200, and some of the steps described can be replaced or eliminated for additional embodiments of the method 200.

At block 210 and block 220, zones of an integrated circuit manufacturing process tool are defined and parameters of the integrated circuit manufacturing process tool are grouped based on the defined zones. Each zone is an area of the integrated circuit manufacturing process tool, and the zones (or areas) are defined based on a physical hardware configuration of the integrated circuit manufacturing process tool. Each area of the integrated circuit manufacturing process tool has parameters associated therewith that are implemented by the integrated manufacturing process tool to perform an integrated circuit manufacturing process. The parameters are thus grouped based on the area of the integrated circuit manufacturing process tool such parameters are associated with.

Figure 5:
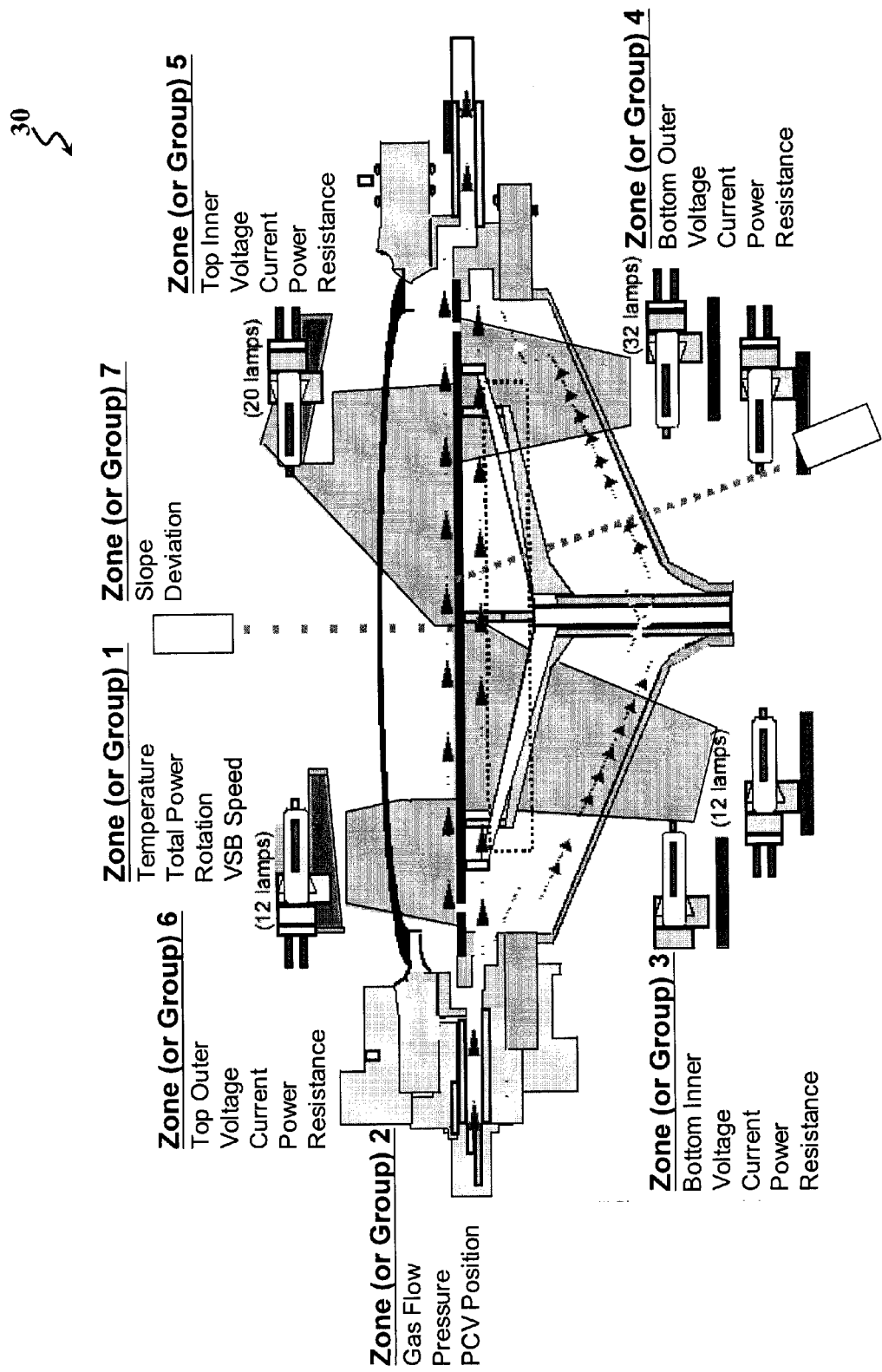
FIG. 5 is a diagrammatic illustration of defining zones of an integrated circuit manufacturing process tool that may be included in the integrated circuit manufacturing system of FIG. 1, and grouping process parameters of the integrated circuit manufacturing process tool based on the defined zones, according to various aspects of the present disclosure.

In the present example, zones of the process tool 30 are defined and parameters of the process tool 30 are grouped based on the defined zones. FIG. 5 is a diagrammatic illustration of defining zones of an integrated circuit manufacturing process tool, such as the process tool 30 of the integrated circuit manufacturing system 10 of FIG. 1, and grouping process parameters of the integrated circuit manufacturing process tool based on the defined zones, according to various aspects of the present disclosure. As discussed above, in the present example, the process tool 30 is a CVD epitaxial tool. Various parameters of the process tool 30 are grouped according to a physical hardware configuration of the process tool 30, such as association with the chamber, gas source, exhaust system, heat source, cooling system, and/or other hardware of the process tool 30. More specifically, seven zones (or areas) of the process tool 30 are defined, and the various parameters are grouped into the seven zones based on what zone each parameter is associated with. For example, Group 1 includes parameters associated with overall conditions of the chamber of the process tool 30, such as temperature, total power, rotation, and VSB speed; Group 2 includes parameters associated with a gas source and exhaust system of the process tool 30, such as gas flow, pressure, and PCV position; Group 3 includes parameters associated with a bottom inner lamp module of the process tool 30, such as voltage, current, power, and resistance; Group 4 includes parameters associated with a bottom outer lamp module of the process tool 30, such as voltage, current, power, and resistance; Group 5 includes parameters associated with a top inner lamp module of the process tool 30, such as voltage, current, power, and resistance; Group 6 includes parameters associated with a top outer lamp module of the process tool 30, such as voltage, current, power, and resistance; and Group 7 includes parameters associated with other aspects of the process tool 30, for example calculated parameters of the process tool 30, such as slope and deviation.

Figure 6:
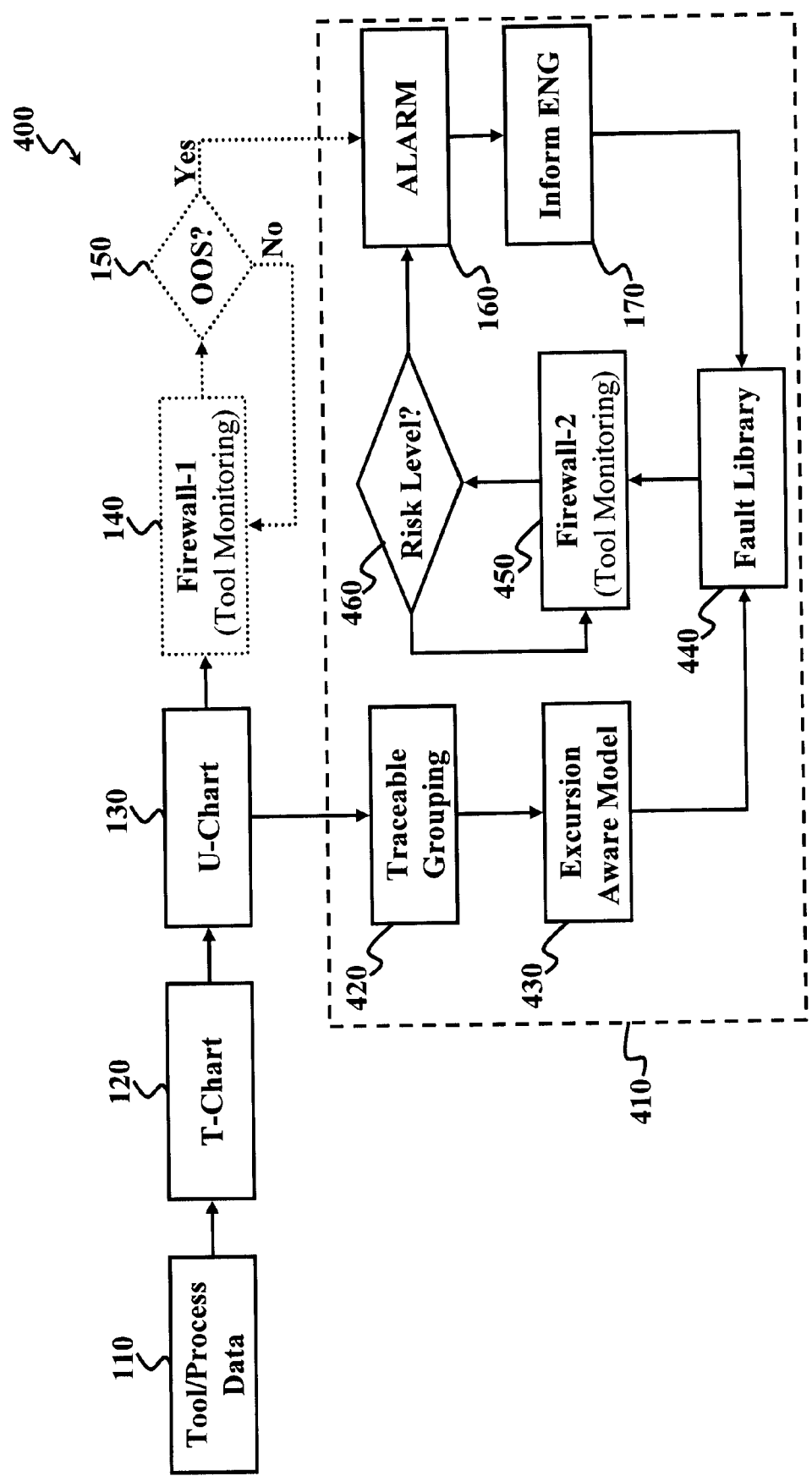
FIG. 6 is a block diagram of a tool monitoring process flow that can be implemented in the method of FIG. 4 to evaluate the condition of the process tool based on grouped parameters of the process tool according to various aspects of the present disclosure.

At block 230, a condition of the integrated circuit manufacturing process tool is evaluated based on the grouped parameters. FIG. 6 is a block diagram of a tool monitoring process flow 400 that can be implemented at block 230 of the method 200 to evaluate a condition of a process tool based on grouped parameters of the process tool according to various aspects of the present disclosure. In the present example, the FDC system 60 implements the tool monitoring process flow 400 at block 230 to evaluate the condition of the process tool 30 based on grouped parameters of the process tool 30, such as the grouped parameters of the process tool 30 depicted in FIG. 5. By monitoring the condition of the process tool 30 based on the grouped parameters, the tool monitoring process flow 400 provides physical meaning to parameter data used to monitor the condition of the process tool 30. Accordingly, the tool monitoring process flow 400 not only indicates faults (or abnormalities) that arise during processing by the process tool 30, but also indicates a general root cause of such faults (or abnormalities), such as a general area of the process tool 30 that may be causing the faults (or abnormalities). Additional steps can be provided in the tool monitoring process flow 400, and some of the steps described can be replaced or eliminated for additional embodiments of the tool monitoring process flow 400.

The tool monitoring process flow 400 includes block 110, block 120, and block 130 of the tool monitoring process flow 100 of FIG. 2, where parameter data is analyzed and reduced as described above. The tool monitoring process flow 400 may further implement the tool monitoring at block 140 through block 170 as described above.

Figure 7:
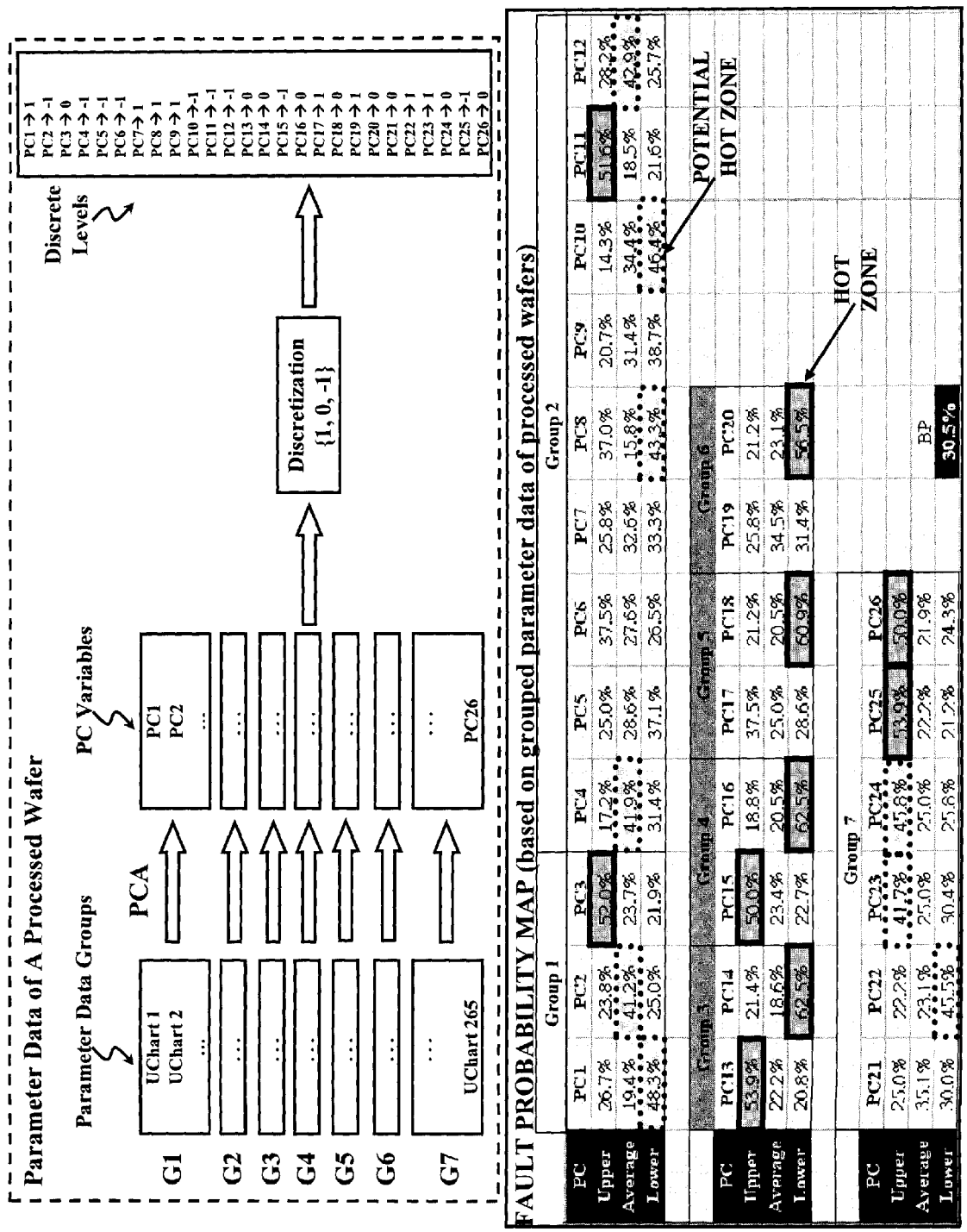
FIG. 7 illustrates an example of analyzing parameter data while associating physical meaning to the parameter data in the tool monitoring process flow of FIG. 6 according to various aspects of the present disclosure.

The tool monitoring process flow 400 further implements a tool abnormality check and obviation (TACO) flow 410 that further analyzes the parameter data while associating physical meaning to the parameter data. FIG. 7 illustrates an example of further analyzing parameter data while associating physical meaning to the parameter data using the TACO flow 410, according to various aspects of the present disclosure. At block 420, the parameter data at block 130 is grouped based on its associated parameters, which have been grouped based on physical association with the process tool (at block 210 and block 220 of the method 200). In the present example, as noted above, various parameters of the process tool 30 are assigned to (or associated with) seven defined zones of the process tool 30. In FIG. 7, considering parameter data associated with a single wafer processed by the process tool 30, the parameter data is assigned to seven groups based on the parameter data's associated parameters. For example, parameter data, such as the statistically analyzed parameter data at block 130 (here, the U-charts), associated with the parameters assigned to Group 1 (G1) (in the present example, temperature, total power, rotation, and VSB speed of the process tool 30) is similarly assigned to Group 1 (G1); parameter data, such as the U-charts, associated with the parameters (in the present example, gas flow, pressure, and PCV position of the process tool 30) assigned to Group 2 (G2) is similarly assigned to Group 2 (G2); and so on for Group 3 (G3), Group 4 (G4), Group 5 (G5), Group 6 (G6), and Group 7 (G7). The parameter data of the single processed wafer is thus grouped based on its physical association with the process tool 30. In the present example, the parameter data of the single processed wafer includes approximately 265 U-charts assigned to the seven groups. It is understood that the parameter data for multiple processed wafers is similarly grouped.

At block 430, the grouped parameter data is further analyzed to determine a pattern exhibited by the grouped parameter data, which may be referred to as an excursion aware model or a fault probability map. In FIG. 7, principle component analysis (PCA) is performed for each group of parameter data to further compress the parameter data into one or more variables, principal component (PC) variables (PC1 ... PCN), that describe a behavior of each group. The principle component analysis is referred to as "knowledge-based" principal component analysis (k-PCA) since each PC variable describes a behavior of a group of parameter data associated with a zone of the process tool 30. The PC variables thus have physical meaning. In the present example, considering the parameter data associated with the single processed wafer, the parameter data is compressed into approximately 26 PC variables. For example, the parameter data of Group 1 is compressed to approximately three PC variables (PC1-PC3); the parameter data of Group 2 is compressed to approximately nine PC variables (PC4-PC12); the parameter data of Group 3, Group 4, Group 5, and Group 6 is compressed to approximately two PC variables (respectively PC13-PC14, PC15-PC16, PC17-PC18, and PC19-PC20); and the parameter data of Group 7 is compressed to approximately six PC variables (PC21-PC26).

Discretization then normalizes the PC variables (here, PC1-PC26) so that the different PC variables may be compared, thereby enhancing correlation between the PC variables and the inline measurements. Essentially, a continuous data set is converted into a discrete form. In the present example, a z-normalization is applied to the PC variables, which involves mean-centering each PC variable and then scaling each PC variable with its standard deviation, expressed in the following equation:

$$z = \frac{(x - \bar{x})}{\sigma} \quad (1)$$

where z is the scaled value of PC variable x, x is the mean value of PC variable x, and σ is the standard deviation for PC variable x. Equation 1 converts a PC variable x to z by making an assumption that the relative importance of the PC variable is directly related to the standard deviation. Based on the scaled value of each PC variable, each PC variable is assigned a discrete level: 1 (indicating that the PC variable is greater than the normal range), 0 (indicating that the PC variable is within a normal range), or −1 (indicating that the PC variable is less than the normal range). Referring to FIG. 7, each PC variable, PC1-PC26 is assigned a discretization level (or value) for the parameter data of the processed wafer.

The "knowledge-based" principal component analysis (k-PCA) and discretization is applied to grouped parameter data for multiple processed wafers. Such parameter data is then evaluated to provide a fault probability map. The fault probability map exhibits a pattern that defines faults or disease of the process tool 30. To generate the fault probability map, a base probability is defined that indicates a normal level of illness (or fault). The base probability may be determined by evaluating the parameter data of the multiple processed wafers, where the base probability (BP) is expressed in the following equation:

$$BP = \frac{\text{Fault Amount}}{\text{Total Amount}} \times 100\% \quad (2)$$

where Total Amount represents a number of processed wafers in the parameter data set, and Fault Amount represents a number of bad processed wafers in the parameter data set. A processed wafer is considered a "bad" wafer if it inline measurements are out of specification. For example, a processed wafer is considered a bad wafer if its inline measurements, such as its thickness, falls outside an acceptable range, which may be defined by an operator of the system, the SPC system, other entity, or combination thereof. In the present example, in FIG. 7, the base probability is about 30.5%. Then, a fault probability (FP) is defined that describes a level of illness of a specified zone (zone(i,j)), where the specified zone (zone(i,j)) is a specified principal component variable ($PC_j$) with a specified discrete level ($X_j^{disc}$). The fault probability for each specified zone (FP(zone(i,j))) may be determined by evaluating the parameter data of the multiple processed wafers (which has been reduced to PC variables assigned discrete levels), where the fault probability for each specified zone (FP(zone(i,j))) is expressed in the following equation:

$$FP(\text{zone}(i, j)) = \quad (3)$$
$$FP(PC = PC_i, x = X_j^{disc}) = \frac{\text{Fault Amount}_{zone(i,j)}}{\text{Total Amount}} \times 100\%$$

where Total Amount represents a number of processed wafers in the parameter data set, and Fault Amount$_{zone(i,j)}$ represents a number of processed wafers in the parameter data set that have a specified principal component variable ($PC_j$) with a specified discrete level ($X_j^{disc}$). In the present example, referring to the fault probability map in FIG. 7, 26.7% of the processed wafers in the parameter data are associated with PC variable 1 ($PC_i$=PC1) having an upper discrete level ($X_j^{disc}$=1), 19.4% of the processed wafers in the parameter data are associated with PC variable 1 ($PC_i$=PC1) having an average discrete level ($X_j^{disc}$=0), and 48.3% of the processed wafers in the parameter data are associated with PC variable 1 ($PC_i$=PC1) having a lower discrete level ($X_j^{disc}$=−1). Such analysis is performed for each PC variable of the parameter data to provide the completed fault probability map illustrated in FIG. 7.

The fault probability map is then evaluated for hot zones, such that the fault probability pattern will exhibit a pattern that defines faults or disease of the process tool 30. A hot zone occurs when the fault probability for a specified zone (FP(zone(i,j))) greatly exceeds the base probability (BP), suggesting that a greater level of illness than normal is associated with the specified zone (FP(zone(i,j)), as expressed in the following equation:

$$\text{Hot Zone} = FP(\text{zone}(i,j)) \gg BP. \quad (4)$$

For the sake of example, referring to the fault probability map in FIG. 7, assuming that hot zones occur when the fault probability for a specified zone (FP(zone(i,j)) exceeds the base probability by about 20% (FP(zone(i,j)>50.5%), and potential hot zones occur where the fault probability for a specified zone (FP(zone(i,j)) exceeds the base probability by about 10% (FP(zone(i,j)>40.5%), hot zones and potential hot zones of the probability map are highlighted (bold, thick outlines indicate hot zones and bold, dotted outlines indicate potential hot zones).

Returning to the tool monitoring process flow 400 in FIG. 6, at block 440, the fault probability map (or excursion aware model) is stored in a fault library, such that a library of fault probability maps exhibiting various patterns is collected so that the FDC system 60 can learn a pattern that defines faults or disease of the process tool 30. At block 450 and block 460, the FDC system 60 evaluates the fault probability map to determine whether a risk level associated with the fault probability map, and whether the risk level warrants triggering an alarm. In FIG. 7, as noted above, the fault probability map exhibits a pattern that defines faults or disease of the process tool 30. For example, PC13 and PC14 associated with Group 3, PC15 and PC16 associated with Group 4, PC18 associated with Group 5, and PC20 associated with Group 6 all indicate hot zones, suggesting a greater level of illness than normal. Because Group 3, Group 4, Group 5, and Group 6 are associated with the lamp modules of the process tool 30 (see FIG. 5), the fault probability map indicates that a lamp module issue is likely a root cause of any fault (or abnormality). Based on a specified criteria, the FDC system 60 may determine that the pattern of the hot zones exhibited by the fault probability map in FIG. 7 presents a sufficient risk level to, at block 160, trigger an alarm and, at block 170, notify an operator or engineer of the process tool 30. Based on the fault probability map, an operator or engineer knows the likely source of any fault (or abnormality) in the process tool 30 (here, one or more of the lamp modules), such that the operator (or engineer) can start with the likely source without having to troubleshoot every area of the process tool 30.

The FDC system 60 may evaluate the pattern exhibited by the fault probability map by comparing the fault probability map, such as that depicted in FIG. 7, to various fault probability maps in the fault library. If the FDC system 60 determines that the fault probability map is not similar to any fault probability map in the fault library, the FDC system 60 determines whether the pattern exhibited by the fault probability map warrants a risk level sufficient to trigger the alarm at block 160, and thus, the operator or engineer of the process tool 30 at block 170. If the FDC system 60 determines that the fault probability map is similar to a fault probability map in the fault library, the FDC system 60 determines whether such fault probability maps are associated with an identified issue (root cause) of a fault (or abnormality) in the process tool 30. If the fault probability maps are associated with an identified issue (root cause) of a fault (or abnormality) of the process tool 30, at block 160, the FDC system 60 triggers an alarm and, at block 170, notifies an operator or engineer of the process tool 30. In conjunction with the alarm, the FDC system 60 may halt the process performed by the process tool 30, take another action, or a combination thereof. The operator or engineer then fixes the area of the process tool 30 identified by the fault probability maps. If the fault probability maps are not yet associated with an identified issue (root cause) of a fault (or abnormality) of the process tool 30, the FDC system 60 may or may not trigger an alarm. If the FDC system 60, at block 160, triggers an alarm and, at block 170, notifies an operator or engineer of the process tool 30, the operator or engineer evaluates the area of the process tool 30 associated with any hot zones that the pattern of the fault probability maps exhibit. Then, if the operator or engineer identifies the issue (root cause) that results in the pattern exhibited by the fault probability maps, the operator or engineer can update the fault library to reflect that such fault probability maps are associated with an identified issue (root cause).

The methods and systems described herein can take the form of an entirely hardware embodiment, an entirely software embodiment, or an embodiment containing both hardware and software elements. Further, the methods and system described herein, or certain aspects or portions thereof, may take the form of program code (instructions) embodied in tangible media, such as floppy diskettes, CD-ROMS, hard drives, or any other machine-readable storage medium, wherein, when the program code is loaded into and executed by a machine, such as a computer, the machine becomes an apparatus for practicing the present disclosure. The methods and apparatus of the present invention may also be embodied in the form of program code transmitted over some transmission medium, such as electrical wiring or cabling, through fiber optics, or via any other form of transmission, wherein, when the program code is received and loaded into and executed by a machine, such as a computer, the machine becomes an apparatus for practicing the present disclosure. When implemented on a general-purpose processor, the program code combines with the processor to provide a unique apparatus that operates analogously to specific logic circuits.

The present disclosure provides for may different embodiments. An exemplary method includes defining zones of an integrated circuit manufacturing process tool; grouping parameters of the integrated circuit manufacturing process tool based on the defined zones; and evaluating a condition of the integrated circuit manufacturing process tool based on the grouped parameters. The zones may be defined as areas of the integrated circuit manufacturing process tool based on a physical hardware configuration of the integrated circuit manufacturing process tool, and the parameters of the integrated circuit manufacturing process tool may be grouped by assigning each parameter to its associated area of the integrated circuit manufacturing process tool. Evaluating the condition of the integrated circuit manufacturing process tool based on the grouped parameters may include identifying a possible cause of a detected fault, where identifying the possible cause includes identifying at least one of the zones of the integrated circuit manufacturing process tool that is the possible cause of the fault.

In an example, the method includes collecting parameter data associated with the grouped parameters when the integrated circuit manufacturing process tool performs a process on a plurality of wafers. Evaluating the condition of the integrated circuit manufacturing process tool based on the grouped parameters may include evaluating a pattern exhibited by the parameter data associated with the grouped parameters. The method may further include issuing an alarm if the pattern exhibited by the parameter data associated with the grouped parameters indicates a fault, where the pattern indicates at least one of the zones of the integrated circuit manufacturing process tool that is a possible cause of the fault. Evaluating the pattern exhibited by the parameter data associated with the grouped parameters may include comparing the pattern with another pattern exhibited by parameter data of previously processed wafers associated with the grouped parameters.

Another exemplary method includes performing a process on a plurality of wafers by a process tool, wherein the process tool provides parameter data associated with the process performed on each of the plurality of wafers; associating the parameter data to zones of the process tool; and evaluating a condition of the process tool based on a pattern exhibited by the associated parameter data. Associating the parameter data to zones of the process tool includes grouping the parameter data based on a physical hardware configuration of the process tool. The method may further include issuing an alarm if the pattern exhibited by the associated parameter data indicates a fault, where the pattern indicates at least one of the zones of the process tool that possibly causes the fault. The method may further include performing statistical analysis on the associated parameter data to determine the pattern exhibited by the associated parameter data. The method may further include storing the pattern exhibited by the associated parameter data; and using the stored pattern to evaluate the condition of the process tool based on a pattern exhibited by associated parameter data of subsequently processed wafers.

In an example, the pattern exhibited by the associated parameter data indicates a fault; and evaluating the condition of the process tool based on the pattern exhibited by the associated parameter data includes identifying at least one of the zones of the process tool that is a possible cause of the fault based on the pattern. In another example, evaluating the condition of the process tool based on the pattern exhibited by the associated parameter data includes determining whether the pattern exhibited by the associated parameter data is similar to any patterns exhibited by associated parameter data of previously processed wafers. If the pattern is similar to a pattern exhibited by associated parameter data of previously processed wafers, the method may further include issuing an alarm if the similar pattern is associated with an identified process tool issue, such as hardware failure of the process tool.

An exemplary integrated circuit manufacturing system includes a process tool configured to provide parameter data associated with the process tool processing wafers; and a fault detection and classification system in communication with the process tool. The fault detection and classification system is configured to define zones of the process tool, group the provided parameter data based on the defined zones, and evaluate a condition of the process tool based on the grouped, provided parameter data. The zones of the process tool may be defined based on a physical hardware configuration of the process tool, and the provided parameter data may be grouped by assigning parameter data to its associated physical hardware of the process tool. The condition of the process tool may be evaluated based on a pattern exhibited by the grouped, provided parameter data.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   defining zones of an integrated circuit manufacturing process tool, such that each of the zones corresponds to one or more hardware components of the integrated circuit manufacturing process tool;
   for each of the zones, grouping a subset of parameters of the integrated circuit manufacturing process tool into the zone based on the corresponding one or more hardware components;
   collecting inline parameter data associated with the parameters via at least one sensor associated with the integrated circuit manufacturing tool;
   for each of the zones, performing principle component analysis on a portion of the inline parameter data associated with the respective subset of parameters of the zone, wherein the principle component analysis includes:
      generating a probability mapping;
      utilizing the probability mapping to determine a set of principle components based on the portion of the inline parameter data; and
      reducing the set of principle components such that there are fewer principle components than parameters associated with the zone; and
   evaluating a condition of the integrated circuit manufacturing process tool based on the grouped parameters and the principle components of the principle component analysis.

2. The method of claim 1 wherein the defining zones of the integrated circuit manufacturing process tool includes defining areas of the integrated circuit manufacturing process tool based on a physical hardware configuration of the integrated circuit manufacturing process tool.

3. The method of claim 2 wherein the grouping parameters of the integrated circuit manufacturing process tool based on the defined zones includes assigning each parameter to its associated area of the integrated circuit manufacturing process tool.

4. The method of claim 1, wherein the inline parameter data is collected when the integrated circuit manufacturing process tool performs a process on a plurality of wafers.

5. The method of claim 4 wherein the evaluating the condition of the integrated circuit manufacturing process tool based on the grouped parameters and the principle component analysis includes evaluating a pattern exhibited by the inline parameter data associated with the grouped parameters.

6. The method of claim 5 further including issuing an alarm if the pattern exhibited by the inline parameter data indicates a fault, wherein the pattern indicates at least one of the zones of the integrated circuit manufacturing process tool that is a possible cause of the fault.

7. The method of claim 5 wherein the evaluating the pattern exhibited by the inline parameter data associated with the grouped parameters includes comparing the pattern with another pattern exhibited by inline parameter data of previously processed wafers associated with the grouped parameters.

8. The method of claim 1 wherein the evaluating the condition of the integrated circuit manufacturing process tool based on the grouped parameters and the principle component analysis includes identifying a possible cause of a detected fault.

9. The method of claim 8 wherein the identifying the possible cause of the detected fault includes identifying at least one of the zones of the integrated circuit manufacturing process tool that is the possible cause of the fault.

10. A method comprising:
performing a process on a plurality of wafers by a process tool, wherein the process tool provides inline parameter data associated with the process performed on each of the plurality of wafers;
grouping the parameter data according to a plurality of zones of the process tool, wherein each zone of the plurality of zones is associated with at least one hardware component of the process tool; and
evaluating a condition of the process tool based on a pattern exhibited by the inline parameter data, wherein the evaluating includes:
for each zone of the plurality of zones, performing a principle component analysis on a portion of the inline parameter data associated with the zone, wherein the principle component analysis includes:
generating a probability mapping;
determining a set of principle components for the portion of the inline parameter data based on the probability mapping; and
reducing the set of principle components such that there are fewer principle components associated with the zone than parameters associated with the zone; and
comparing a result of the principle component analysis to a library of known patterns.

11. The method of claim 10 wherein the grouping of the inline parameter data includes grouping the inline parameter data based on a physical hardware configuration of the process tool.

12. The method of claim 10 further including issuing an alarm if the pattern exhibited by the associated inline parameter data indicates a fault, wherein the pattern indicates at least one of the zones of the process tool that possibly causes the fault.

13. The method of claim 10 wherein the performing of the principle component analysis further includes:
assessing a value of each principle component of the set of principle components as one of: greater than one standard deviation above a mean, within one standard deviation of the mean, or greater than one standard deviation below the mean; and
determining, using the probability mapping, a fault probability associated with the assessed value of the respective principle component,
wherein the comparing of the result of the principle component analysis to a library of known patterns includes comparing the fault probability to the library of known patterns.

14. The method of claim 10 wherein the comparing of the result of the principle component analysis to the library of known patterns includes determining whether the pattern exhibited by the associated inline parameter data is similar to any patterns exhibited by associated inline parameter data of previously processed wafers.

15. The method of claim 14 further including, if the pattern is similar to a pattern exhibited by associated inline parameter data of previously processed wafers, issuing an alarm if the similar pattern is associated with an identified process tool issue.

16. The method of claim 10 wherein:
the pattern exhibited by the associated inline parameter data indicates a fault; and
the evaluating the condition of the process tool based on the pattern exhibited by the associated inline parameter data further includes identifying at least one of the plurality of zones of the process tool that is a possible cause of the fault based on the pattern.

17. The method of claim 10 further including:
storing the pattern exhibited by the associated inline parameter data; and
using the stored pattern to evaluate the condition of the process tool based on a pattern exhibited by associated inline parameter data of subsequently processed wafers.

18. An integrated circuit manufacturing system comprising:
a process tool including at least one sensor operable to provide inline parameter data associated with the process tool processing wafers; and
a fault detection and classification system in communication with the process tool, wherein the fault detection and classification system includes a processor operable to:
define zones of the process tool such that each of the zones is associated with at least one hardware element of the process tool,
group the inline parameter data based on the defined zones,
for each of the zones, perform a principle component analysis process on a portion of the inline parameter data grouped in the zone to determine, based on a generated probability map, a set of principle components of the portion such that there are fewer principle components in the set than parameters associated with the respective zone, and
evaluate a condition of the process tool based on a result of the principle component analysis process performed on the grouped, provided inline parameter data.

19. The integrated circuit manufacturing system of claim 18 wherein the processor of the fault detection and classification system is further operable to:
define the zones of the process tool based on a physical hardware configuration of the process tool; and
group the provided inline parameter data by assigning inline parameter data to its associated physical hardware of the process tool.

20. The integrated circuit manufacturing system of claim 18 wherein the processor of the fault detection and classification system is further operable to evaluate the condition of the process tool based on a pattern exhibited by the grouped, provided inline parameter data.

* * * * *